United States Patent
Fedigan et al.

(10) Patent No.: US 9,413,163 B2
(45) Date of Patent: Aug. 9, 2016

(54) MOTOR FAULT DETECTOR

(71) Applicant: Texas Instruments Incorporated, Dallas, TX (US)

(72) Inventors: Stephen John Fedigan, Plano, TX (US); Sandun Shivantha Kuruppu, Dallas, TX (US); Paul LeRoy Brohlin, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 124 days.

(21) Appl. No.: 14/309,735

(22) Filed: Jun. 19, 2014

(65) Prior Publication Data

US 2015/0372631 A1 Dec. 24, 2015

(51) Int. Cl.
*H02P 27/06* (2006.01)
*H02H 7/08* (2006.01)
*G01R 31/34* (2006.01)
*G01R 27/16* (2006.01)

(52) U.S. Cl.
CPC .............. *H02H 7/0822* (2013.01); *G01R 27/16* (2013.01); *G01R 31/343* (2013.01)

(58) Field of Classification Search
USPC .............. 318/375, 490, 634, 701; 324/765.01
See application file for complete search history.

(56) References Cited

U.S. PATENT DOCUMENTS

| | | | |
|---|---|---|---|
| 4,904,918 A * | 2/1990 | Bailey | H02P 3/18 318/759 |
| 5,689,169 A * | 11/1997 | Kerkman | 318/772 |
| 5,705,905 A * | 1/1998 | Wood | G01R 27/02 318/490 |
| 5,821,723 A * | 10/1998 | Kim | H02P 25/08 318/400.11 |
| 6,035,265 A | 3/2000 | Dister et al. | |
| 7,368,846 B2 * | 5/2008 | Mushika | G02B 26/0841 310/309 |
| 2004/0227479 A1 * | 11/2004 | Youm | H02P 3/22 318/375 |
| 2008/0054835 A1 * | 3/2008 | Tamaru | H02P 25/08 318/634 |
| 2011/0115424 A1 * | 5/2011 | Vilain | H02P 6/185 318/721 |
| 2011/0304351 A1 * | 12/2011 | Cop | G01R 31/34 324/765.01 |
| 2012/0217920 A1 * | 8/2012 | Singh | G01R 31/42 318/490 |
| 2014/0117912 A1 | 5/2014 | Gajic et al. | |

FOREIGN PATENT DOCUMENTS

| | | |
|---|---|---|
| EP | 1936393 A1 | 6/2008 |
| EP | 2902793 A1 | 8/2015 |
| RU | 2208236 C2 | 7/2003 |
| RU | 2262794 C2 | 10/2005 |
| RU | 122214 U1 | 11/2012 |
| RU | 2498327 C1 | 11/2013 |

* cited by examiner

*Primary Examiner* — Eduardo Colon Santana
*Assistant Examiner* — Cortez Cook
(74) *Attorney, Agent, or Firm* — John R. Pessetto; Frank D. Cimino

(57) ABSTRACT

A motor control circuit includes a processor configured to calculate a plurality of motor impedances from measurements of an excitation voltage on a power bus to a motor and measurements of a plurality of currents through the motor resulting from the excitation voltage, and the processor configured to calculate individual winding inductances in the motor, based on the measured motor impedances, and configured to determine whether there is an inter-turn winding fault based on the calculated individual winding inductances.

2 Claims, 2 Drawing Sheets

MOTOR FAULT DETECTOR

BACKGROUND

Inverter-driven motors are widely used in many industrial applications. The insulation on the stator windings of these motors is subject to deterioration due to high transient voltages, inverter cable reflections, mechanical stress, high temperatures, and aging. As a result, the insulation can fail, resulting in inter-turn winding faults (shorts from one part of a winding to another part of the winding). These inter-turn faults reduce efficiency and may cause excess heating, which may eventually cascade to irreversible damage such as melted conductors and motor failure. Given the cost of an interruption of critical systems being driven by these motors, it is important to detect inter-turn winding faults before irreversible damage occurs. Typically, detection of inter-turn winding faults involves monitoring of the motor currents and voltages and using a processor to analyze any asymmetries of currents through the motor, or to analyze differences in motor currents between a healthy motor and one with winding faults. In some embodiments, the inverter switches are used to inject voltages at a frequency higher than the normal switching frequency, and the resulting currents are analyzed by a processor. Analysis of motor currents requires significant processor resources, and using the inverter's switches to inject higher frequency voltages can result in audible noise. There is an ongoing need for improved detection of motor faults.

DETAILED DESCRIPTION

Figure 1:
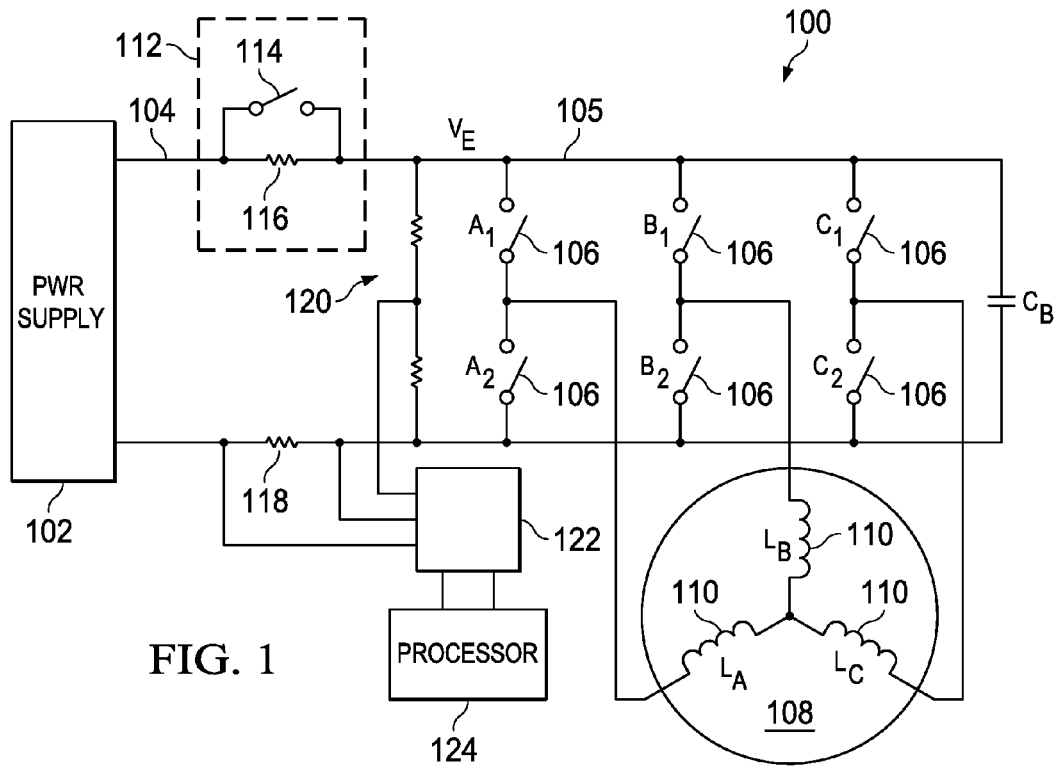
FIG. 1 is a block diagram schematic of an example embodiment of a motor driver circuit.

FIG. 1 illustrates an example embodiment of a motor driver circuit 100 with details omitted to simplify illustration and discussion. In FIG. 1, a power supply 102 provides a DC voltage on a power bus (104, 105). Electronic switches 106 function as an inverter (transforming DC to AC) to drive a motor 108. The switches 106 sequentially drive stator windings 110 in the motor 108. In the example of FIG. 1, a chopper circuit 112, comprising a switch 114 and resistor 116, generates an excitation voltage $V_E$ on the power bus 105 to the motor 108. A voltage divider 120 serves as a sensor for monitoring the amplitude of the excitation voltage $V_E$ on the power bus 105. A resistor 118 serves as a sensor for monitoring current through the motor 108 resulting from the excitation voltage $V_E$. A motor impedance measurement circuit 122 measures the amplitude of the excitation voltage $V_E$ and a plurality of currents resulting from the excitation voltage $V_E$ at a plurality of switch states. A processor 124 computes a plurality of motor impedances from the amplitude of the excitation voltage $V_E$ and the plurality of currents measured by the motor impedance measurement circuit 122. The processor 124 then computes individual stator winding inductances from the motor impedance calculations. The processor 124 then determines whether one or more of the stator windings 110 has an inter-turn winding fault, based on the computed stator winding inductances.

The chopper circuit 112 causes a bus capacitor $C_B$ to linearly charge and discharge at the frequency of the chopper circuit 112. Preferably, the chopper circuit 112 generates an excitation voltage with a frequency that is substantially higher than human audio perception and at least ten times higher than the switching rate of the switches 106. Alternatively, if the switches are pulse width modulated (PWM), then the frequency of the excitation voltage is preferably at least ten times higher than the PWM carrier signal frequency, which may be on the order of 10 KHz. For example, the frequency of the excitation voltage may be on the order of 100 KHz.

Figure 2:
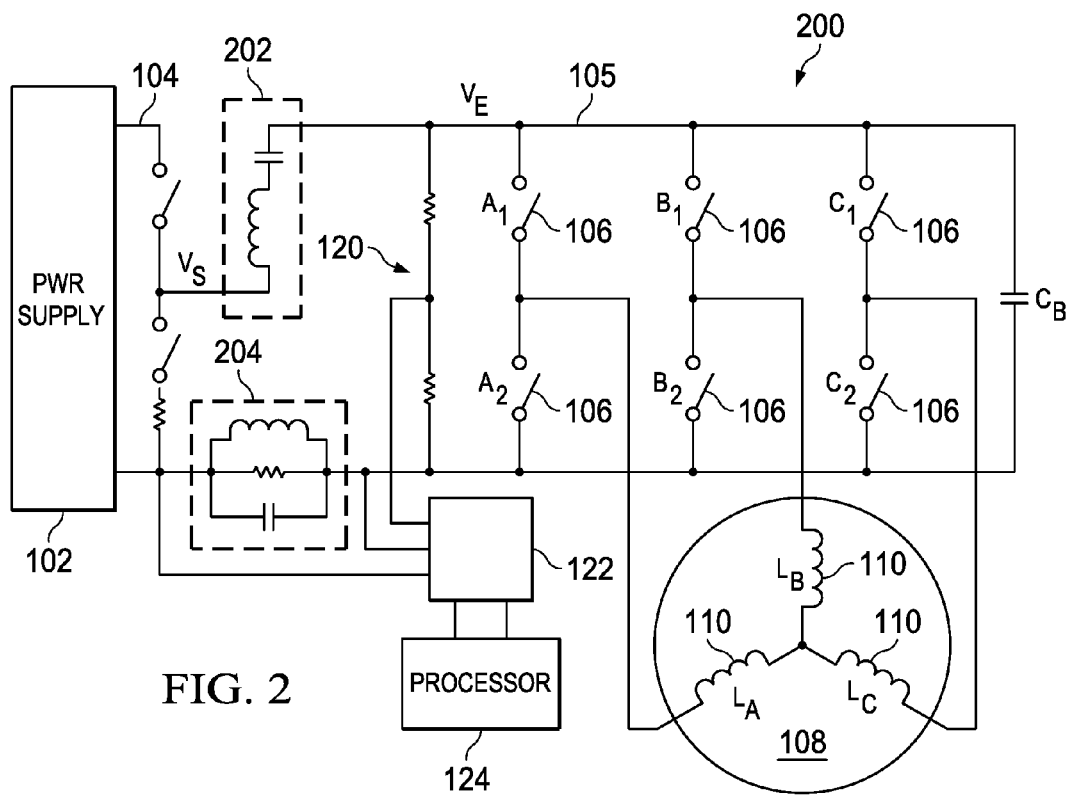
FIG. 2 is a block diagram schematic of an alternative example embodiment of a motor driver circuit.

High frequency harmonics in a square wave excitation voltage may result in significant current in the bus capacitor $C_B$. FIG. 2 illustrates an alternative example motor drive circuit 200, which reduces the current in the bus capacitor $C_B$ and improves the current measurement sensitivity. In FIGS. 1 and 2, elements having the same reference numbers are identical. In the example of FIG. 2, a square wave signal $V_S$ is coupled to the power bus 105 through a series L-C circuit 202. The series L-C circuit 202 functions as a band pass filter, resulting in a sinusoidal excitation voltage $V_E$ on the power bus 105. A sinusoidal excitation eliminates high frequency harmonics, which reduces the current through the bus capacitor $C_B$. In FIG. 2, a resonant R-L-C circuit 204 serves as a sensor for monitoring current through the motor 108. Circuit 204 has a resonant frequency that is the same as the frequency of the excitation voltage, which improves current measurement sensitivity while presenting a much lower impedance at the switching frequency or PWM carrier frequency of the switches 106.

At the frequency of the excitation voltage, the motor impedance is effectively an inductance. As the motor rotates, the motor impedance varies, and the variation of motor impedance modulates both the amplitude and phase of the current resulting from the excitation voltage. In FIGS. 1 and 2, the individual stator windings 110 have inductances labeled $L_A$, $L_B$, and $L_C$. Switches 106 are also designated by A, B, and C, with the top switches having a subscript of "1" and the bottom switches having a subscript of "2". During a first switch state, inductance $L_A$ is switched to the bus voltage (switch $A_1$ is closed) and inductances $L_B$ and $L_C$ are switched to the bus return (switches $B_2$, and $C_2$ are closed) (switches $A_2$, $B_1$, and $C_1$ are open). During the first switch state the motor impedance seen by the excitation voltage $V_E$ is $L_A+(L_B$ in parallel with $L_C)$. During a second switch state, inductance $L_B$ is switched to the bus voltage (switch $B_1$ is closed) and inductances $L_A$ and $L_C$ are switched to the bus return (switches $A_2$ and $C_2$ are closed) (switches $A_1$, $B_2$, and $C_1$ are open). During the second switch state, the motor impedance seen by the excitation voltage $V_E$ is $L_B+(L_A$ in parallel with $L_C)$. During a third switch state, inductance $L_C$ is switched to the bus voltage (switch $C_1$ is closed) and inductances $L_A$ and $L_B$ are switched to the bus return (switches $A_2$ and $B_2$ are closed) (switches $A_1$, $B_1$, and $C_2$ are open). During the third switch state the motor impedance seen by the excitation voltage $V_E$ is $L_C+(L_A$ in parallel with $L_B)$.

Figure 3:
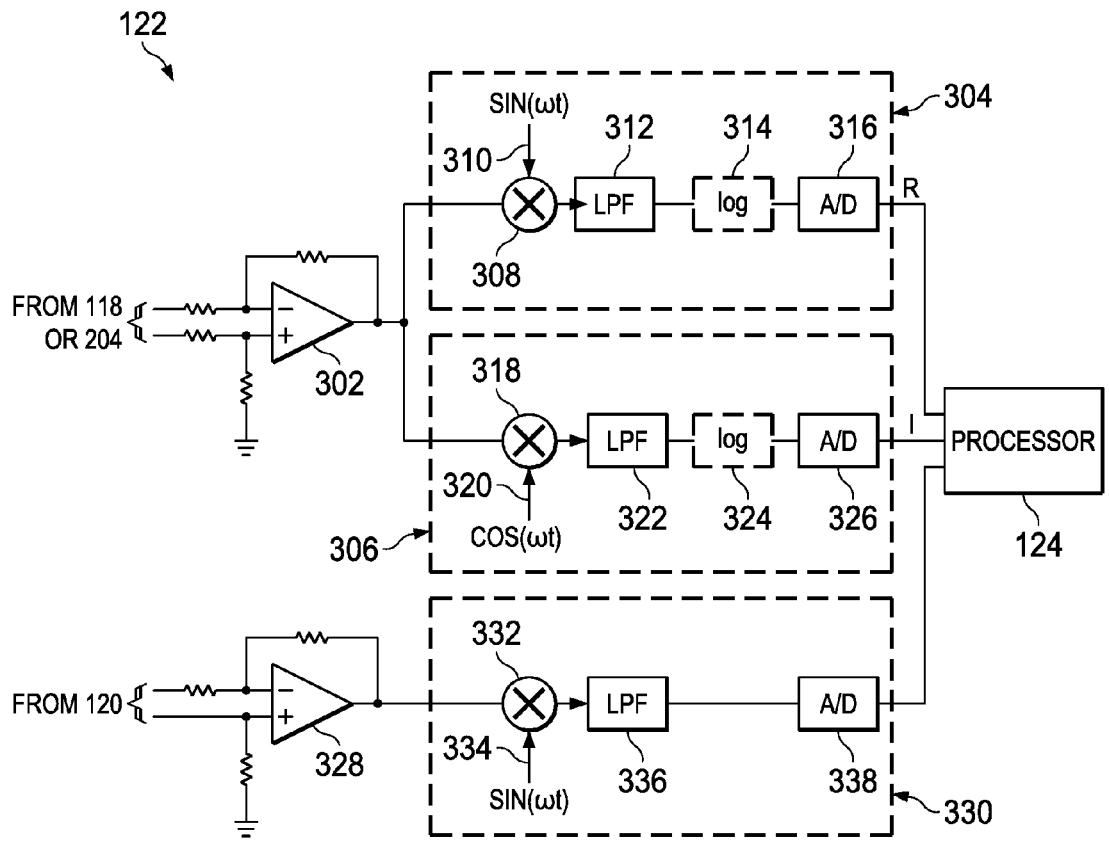
FIG. 3 is a block diagram schematic illustrating additional detail for a motor impedance measurement circuit, which is part of the motor driver circuits of FIGS. 1 and 2.

FIG. 3 illustrates an example embodiment of the motor impedance measurement circuit 122. The motor impedance measurement circuit 122 measures motor current at the frequency of the excitation voltage $V_E$. As discussed above, the excitation current sensed by the motor impedance measurement circuit 122 is modulated in amplitude and phase. For current measurement, the motor impedance measurement circuit 122 comprises a synchronous demodulator comprising a differential amplifier 302 followed by two synchronous detectors (304, 306). Synchronous detector 304 comprises a multiplier 308 that multiplies the amplified current signal by a signal 310 having the same frequency and phase as the excitation voltage $V_E$. The multiplier 308 is followed by a low pass filter (or integrator) 312, optionally a logarithmic amplifier 314 (to optionally improve sensitivity), and an analog-todigital converter (A/D) 316. Synchronous detector 306 comprises a multiplier 318 that multiplies the amplified current signal by a signal 320 having the same frequency as the excitation voltage $V_E$ but having a phase that is ninety degrees offset from the phase of the excitation voltage $V_E$. The multiplier 318 is followed by a low pass filter (or integrator) 322, optionally a logarithmic amplifier 324, and an A/D 326. The digital output of A/D 316 is the real part "a" of a complex number, and the digital output of A/D 326 is the imaginary part "b" of the complex number. During each switch state, the processor 124 receives the outputs of the A/D's 316 and 326 and computes the magnitude and phase of the motor current, as follows:

$$I_1 = \sqrt{(a_1^2 + b_1^2)} \quad \text{Equation 1}$$

$$I_2 = \sqrt{(a_2^2 + b_2^2)} \quad \text{Equation 2}$$

$$I_3 = \sqrt{(a_3^2 + b_3^2)} \quad \text{Equation 3}$$

$$\theta_1 = \tan\left(\frac{b_1}{a_1}\right) \quad \text{Equation 4}$$

$$\theta_2 = \tan\left(\frac{b_2}{a_2}\right) \quad \text{Equation 5}$$

$$\theta_3 = \tan\left(\frac{b_3}{a_3}\right) \quad \text{Equation 6}$$

In the above equations, for example, $a_1$ is the output of A/D 316 during the first switch state and represents the real part of a complex number, and $b_1$ is the output of A/D 326 during the first switch state and represents the imaginary part of a complex number. $I_1$ is the computed magnitude of the motor current resulting from the excitation voltage $V_E$ during the first switch state. $\Theta_1$ is the computed phase of the motor current resulting from the excitation voltage $V_E$ during the first switch state.

As discussed above, the motor impedance circuit 122 also measures the excitation voltage $V_E$. In FIG. 3, the output of the voltage divider 120 is amplified by an amplifier 328 and the resulting signal is processed by a synchronous detector 330. The synchronous detector 330 enables rejection of square wave harmonics and enables measurement of the synchronous frequency component of the excitation voltage $V_E$. The synchronous detector 330 comprises a multiplier 332 that multiplies the amplified voltage signal by a signal 334 having the same frequency and phase as the excitation voltage $V_E$. The multiplier 332 is followed by a low pass filter (or integrator) 336, and an analog-to-digital converter (A/D) 338. The processor 124 monitors the digital output of the A/D 338. The processor 124 then computes motor impedance as the measured excitation voltage $V_E$ divided by the motor current, as follows:

$$Z_1 = \frac{V_E}{I_1} \quad \text{Equation 7}$$

$$Z_2 = \frac{V_E}{I_2} \quad \text{Equation 8}$$

$$Z_3 = \frac{V_E}{I_3} \quad \text{Equation 9}$$

The processor 124 computes the motor impedance ($Z_1$, $Z_2$, $Z_3$) for each switch state. The processor then generates three equations with three unknowns ($L_A$, $L_B$, $L_C$) as follows:

$$Z_1 = L_A + \frac{L_B L_C}{L_B + L_C} \quad \text{Equation 10}$$

$$Z_2 = L_B + \frac{L_A L_C}{L_A + L_C} \quad \text{Equation 11}$$

$$Z_3 = L_C + \frac{L_A L_B}{L_A + L_B} \quad \text{Equation 12}$$

The processor 124 then solves for the three individual winding inductances ($L_A$, $L_B$, $L_C$) and the computed winding inductances are analyzed for an inter-turn winding fault. If one of the individual winding inductances ($L_A$, $L_B$, or $L_C$) is different than the others, or different than an expected value, then that motor winding may have an inter-turn fault.

The processor 124 can also detect a failure of the bus capacitance $C_B$. An increase in the amplitude of the excitation voltage $V_E$ may indicate a failed bus capacitance $C_B$. That is, if the bus capacitor's equivalent resistance is increased, then the impedance of the bus capacitor $C_B$ is increased, and the attenuation of the excitation voltage $V_E$ is decreased, and the magnitude of the excitation voltage increases.

Figure 4:
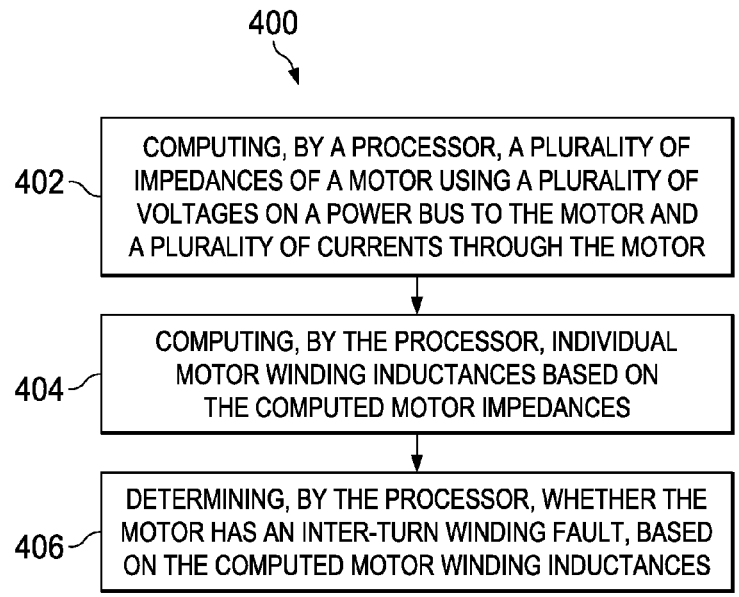
FIG. 4 is flow chart illustrating a method for detecting a motor winding fault.

FIG. 4 illustrates a method 400 for detecting a motor-winding fault. At step 402, a processor computes a plurality of impedances of a motor using a plurality of voltages on a power bus to the motor and a plurality of currents through the motor. At step 404, the processor computes individual motor winding inductances based on the computed motor impedances. At step 406, the processor determines whether the motor has an inter-turn winding fault, based on the computed motor winding inductances.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A motor control circuit, comprising:
   a processor, configured to calculate a plurality of motor impedances from measurements of an excitation voltage on a power bus to a motor and measurements of a plurality of currents through the motor resulting from the excitation voltage; and
   the processor configured to calculate individual winding inductances in the motor, based on the measured motor impedances, and configured to determine when there is an inter-turn winding fault based on the calculated individual winding inductances;
   an excitation circuit for sending the excitation voltage on the power bus to the motor;
   a motor impedance measurement circuit for measuring the excitation voltage on the power bus and a plurality of currents through the motor resulting from the excitation voltage wherein the motor impedance measurement circuit comprises an amplifier followed by two synchronous detectors;
   wherein each synchronous detector further comprises a multiplier that multiplies the output of the amplifier by a signal having the same frequency as the frequency of the excitation voltage; and
   where a first of the two synchronous detectors multiplies the output of the amplifier by a signal having the same phase as the excitation voltage, and the second of the two synchronous detectors multiplies the output of the amplifier by a signal having a phase that is ninety degrees offset from the phase of the excitation voltage the motor impedance measurement circuit further comprising an amplifier followed by two synchronous detectors.

2. A method, comprising:

computing, by a processor, a plurality of impedances of a motor using a plurality of voltages on a power bus to the motor and a plurality of currents through the motor;

computing, by the processor, individual motor winding inductances based on the computed motor impedances; and determining, by the processor, whether the motor has an inter-turn winding fault, based on the computed motor winding inductances;

generating, by an excitation circuit, an excitation voltage on the power bus;

multiplying the measured current by a signal having the same frequency as the frequency of the excitation voltage; and multiplying the measured current by a signal having a phase that is ninety degrees offset from the phase of the excitation voltage.

* * * * *